United States Patent [19]

Satake et al.

[11] Patent Number: 5,545,694

[45] Date of Patent: Aug. 13, 1996

[54] REACTIVE MICROGEL AND PHOTOSENSITIVE RESIN COMPOSITION CONTAINING THE REACTIVE MICROGEL FOR FLEXOGRAPHIC PRINTING PLATE

[75] Inventors: Sunao Satake; Yoshimi Yatsuyanagi; Masahiro Fujii; Ippei Imagawa, all of Tokyo, Japan

[73] Assignee: Toyo Ink Manufacturing Co., Ltd., Tokyo, Japan

[21] Appl. No.: 386,087

[22] Filed: Feb. 9, 1995

[30] Foreign Application Priority Data

Feb. 10, 1994 [JP] Japan .................................. 6-016486

[51] Int. Cl.⁶ .................................................. C08F 269/00
[52] U.S. Cl. .................................................. 525/286
[58] Field of Search .......................................... 525/286

[56] References Cited

U.S. PATENT DOCUMENTS 5,120,796  6/1992  Fukuchi .................................. 525/286

FOREIGN PATENT DOCUMENTS 0556403  8/1993  European Pat. Off. .

OTHER PUBLICATIONS

Patent Abstracts of Japan; JP5032743, Feb. 9, 1993; abstract.

*Primary Examiner*—Bernard Lipman
*Attorney, Agent, or Firm*—Wenderoth, Lind & Ponack

[57] ABSTRACT

A reactive microgel suitable for a photosensitive resin composition for a water-developable flexographic printing plate, which has an average particle diameter of 1 to 10 μm, and is formed of microgel particles, as a core, synthesized from an acrylic monomer in an aqueous medium in the presence of an oil-soluble initiator and in the presence of a reactive polymer emulsifier which is an adduct of a neutralized product of an acrylic copolymer having a tertiary amino group with a compound having an epoxy group and an α,β-unsaturated double bond, and a nonionic emulsifier having an HLB of 12 to 16, and a compound having an epoxy group and an α,β-unsaturated double bond, attached to surfaces of the microgel particles.

9 Claims, No Drawings 5,545,694

REACTIVE MICROGEL AND PHOTOSENSITIVE RESIN COMPOSITION CONTAINING THE REACTIVE MICROGEL FOR FLEXOGRAPHIC PRINTING PLATE

FIELD OF THE INVENTION

The present invention relates to a novel reactive microgel and a photosensitive resin composition for a water-developable flexographic printing plate. More specifically it relates to a reactive microgel having water-developability useful as a raw material for a water-developable flexographic printing plate, and a photosensitive resin composition containing the reactive microgel used for a water-developable flexographic printing plate.

PRIOR ART OF THE INVENTION

In recent years, flexographic printing has been spotlighted with the modernization of packaging. The method of producing a conventional flexographic printing plate requires at least three steps of the preparation of a printing plate of a metal, the replication and the vulcanization of a rubber, and these steps require technical proficiency and a long period of time for the production. That is, the conventional flexographic printing plate has been expensive. For overcoming this defect, a solvent-developable printing plate of a photosensitive resin has been developed so that a flexographic printing plate can be produced in a simple process. For the solvent-developable printing plate, however, it is required to use a halogen-containing solvents such as trichloroethylene or perchloroethylene as a developer solution. The solvent-developable printing plate therefore tends to be limited in use in view of recent problems of an adverse influence on the environment and harmfulness to a human body.

On the other hand, studies have been made of halogen-free substitute solvents as a developer solution. However, these substitute solvents are limited in use since they are insufficient in development and combustible.

Further, for a solvent-developable flexographic printing plate, a diene-based rubber material having a high molecular weight is used as a raw material in many cases, and the solvent-developable flexographic printing plate structurally has problems in that it is poor in heat resistance, oxidation resistance and ozone resistance. It has been therefore desired to develop a water-developable flexographic printing plate which is harmless to a human body and is free from causing environmental problems.

Under the circumstances, JP-A-60-173055 and JP-A60-211451 discloses compositions containing a hydrophobic elastomeric material and a hydrophilic polymer compound. However, these compositions have a defect in that the flexographic printing plates obtained therefrom are poor in water resistance, since the compositions contain a relatively large amount of the hydrophilic polymer compound for achieving sufficient developability with water.

On the other hand, JP-A-62-173455 and JP-A-63-8648 disclose a photosensitive material containing fine particles of a resin or a microgel, or a composition for a flexographic printing plate. However, it is not sufficient for obtaining developability with water to simply contain the fine particles of a resin or a microgel. Further, this composition in which the fine particles of a resin are dispersed in a matrix having a high molecular weight is an inherently nonhomogeneous system, and a flexographic printing plate made of the composition is non-transparent due to the refractive index difference of the composition. As a result, no sufficient resolution can be accomplished. Further, when attempts are made to use a raw material which does not cause the refractive index difference, it is still difficult to satisfy other properties required of a flexographic printing plate.

Further, JP-A-5-150451 discloses a water-developable photosensitive resin composition containing three-dimensionally crosslinked fine particles produced from a conjugated diene monomer, a hydrophobic elastomer having a diene-based unit and a hydrophilic polymer. This composition shows the rubbery resilience which a flexographic printing plate is required to have, while it is poor in water resistance since a hydrophilic polymer is contained. Further, it is poor in heat resistance, oxidation resistance and ozone resistance since a conjugated diene-based material contained, and it is therefore required to incorporate relatively large amounts of an antioxidant and an agent for the prevention of deterioration with ozone. Moreover, a pressure apparatus is required for obtaining crosslinked fine particles by the polymerization of the diene-based monomer.

On the other hand, the present inventors have found that the following resin composition for a water-developable flexographic printing plate has sufficient rubbery resilience and sufficient water resistance, and have already proposed the same (see JP-A-05-32743). This resin composition comprises a microgel having core and shell portions bonded to each other and having a hydrophilic group and a reactive group on its surface, obtained by copolymerizing an acrylic monomer containing a tertiary amino group and other acrylic monomer, neutralizing the resultant copolymer with an acid, adding an epoxy group and an $\alpha,\beta$-ethylenically unsaturated compound to the neutralized copolymer to prepare a reactive polymer emulsifying agent, polymerizing a polydiene-based acrylate and/or a polyurethane-based acrylate in the presence of the reactive polymer emulsifying agent, and further adding an epoxy group and an $\alpha,\beta$-ethylenically unsaturated compound to the surface of the resultant resin fine particles, a diene-based polymer and a photosensitive monomer. However, the above resin composition is somewhat poor in heat resistance, oxidation resistance and ozone resistance due to the diene-based material. Further, there is another defect in that since the polybutadiene-based acrylate and the polyurethane-based acrylate are expensive, the flexographic printing plate is expensive.

SUMMARY OF THE INVENTION

It is an object of the present invention to provide a novel reactive microgel which can be suitably applied to a photosensitive resin composition for a water-developable flexographic printing plate.

It is another object of the present invention to provide a novel reactive microgel which can be stably synthesized with a simple apparatus and can be suitably applied to a photosensitive resin composition for a water-developable flexographic printing plate.

It is further another object of the present invention to provide a photosensitive resin composition for a water-developable flexographic printing plate which has rubbery resilience and is excellent in water resistance, oxidation resistance and ozone resistance.

According to the present invention, there is provided a reactive microgel having an average particle diameter of 1 to 10 μm, formed of microgel particles, as a core, synthesized from an acrylic monomer in an aqueous medium in the presence of an oil-soluble initiator and in the presence of a reactive polymer emulsifier which is an adduct of a neutralized product of an acrylic copolymer having a tertiary amino group with a compound having an epoxy group and an α,β-unsaturated double bond, and a nonionic emulsifier having an HLB of 12 to 16, and a compound having an epoxy group and an α,β-unsaturated double bond, attached to surfaces of the microgel particles.

According to the present invention, there is further provided a photosensitive resin composition for a water-developable flexographic printing plate, comprising 30 to 80 parts by weight of the above reactive microgel (A), 5 to 60 parts by weight of an ethylene-vinyl acetate copolymer and/or an ethylene-ethyl acrylate copolymer (B), 1 to 60 parts by weight of a compound having an α,β-ethylenically unsaturated double bond (C) and 0.01 to 10 parts by weight of a photopolymerization initiator (D).

DETAILED DESCRIPTION OF THE INVENTION

The reactive microgel of the present invention will be explained hereinafter. The reactive microgel of the present invention has an average particle diameter of 1 to 10 μm, and is formed of microgel particles, as a core, synthesized from an acrylic monomer in an aqueous medium in the presence of an oil-soluble initiator and in the presence of a reactive polymer emulsifier which is an adduct of a neutralized product of an acrylic copolymer having a tertiary amino group with a compound having an epoxy group and an α,β-unsaturated double bond, and a nonionic emulsifier having an HLB of 12 to 16, and a compound having an epoxy group and an α,β-unsaturated double bond, attached to surfaces of the microgel particles.

The acrylic copolymer having a tertiary amino group is obtained by copolymerizing a monomer having a tertiary amino group such as N,N-dimethylaminoethyl (meth)acrylate or N,N-diethylaminoethyl (meth)acrylate and other acrylic monomer. The "other" acrylic monomer includes $C_1$-$C_{22}$ alkyl (meth)acrylates such as methyl (meth)acrylate, ethyl (meth)acrylate, butyl (meth)acrylate, hexyl (meth)acrylate, 2-ethylhexyl (meth)acrylate, lauryl (meth)acrylate and stearyl (meth)acrylate and (meth)acrylates having a hydroxyl group such as 2-hydroxy (meth)acrylate and hydroxypropyl (meth)acrylate.

The acrylic copolymer having a tertiary amino group preferably has a glass transition temperature (to be referred to as "Tg" hereinafter) of 20° C. or lower to impart the flexographic printing plate with rubbery resilience and flexibility. Further, the content of a component from the monomer having a tertiary amino group in the copolymer is preferably 10 to 50% by weight. When the above content is less than 10% by weight, the polymer emulsifier has insufficient hydrophilic nature, and shows insufficient emulsification performance. When the above content exceeds 50% by weight, the flexographic printing plate shows poor water resistance.

The acrylic copolymer having a tertiary amino group is neutralized with an acid such as hydrochloric acid, formic acid, acetic acid, (meth)acrylic acid or succinic acid, and then a compound having an epoxy group and an α,β-unsaturated double bond is attached thereto, so that the reactive polymer emulsifier is obtained. The compound having an epoxy group and an α,β-unsaturated double bond includes glycidyl acrylate and glycidyl methacrylate.

The nonionic emulsifier having an HLB of 12 to 16 is selected from polyoxyethylene lauryl available, for example, in the trade of Emulgen 108 or 120, polyoxyethylene cetyl ether available, for example, in the trade name of Emulgen 220, polyoxyethylene stearyl alcohol available, for example, in the trade name of Emulgen 320P, polyoxyethylene oleyl ether available, for example, in the trade name of Emulgen 409P or 420, polyoxyethylene octylphenyl ether available, for example, in the trade name of Emulgen 810, polyoxyethylene nonylphenyl ether available, for example, in the trade name of Emulgene 910 or 911, polyoxyethylene sorbitane monolaurate available, for example, in the trade name of RHEODOL TW-S120, polyoxyethylene sorbitol tetraoleate available, for example, in the trade name of RHEODOL 460, polyethylene glycol monolaurate available, for example, in the trade name of EMANON 1112 (Emulgen and EMANON are all trade names of Kao Corp.) and a reactive nonionic emulsifier having an acryloyl group available, for example, in the trade name of Adecalia soap NE-10 (supplied by Asahi Denka K.K.).

The oil-soluble initiator includes 2,2'-azobis(2-methylbutyronitrile), 2,2'-azobisisobutyronitrile, 2,2'-azobis(2,4-dimethylvaleronitrile) and 2,2'-azobis(4-methoxy-2,4-dimethylvaleronitrile).

The acrylic monomer to form a core includes $C_1$-$C_{22}$ alkyl (meth)acrylates such as methyl (meth)acrylate, ethyl (meth)acrylate, butyl (meth)acrylate, hexyl (meth)acrylate, 2-ethylhexyl (meth)acrylate, lauryl (meth)acrylate and stearyl (meth)acrylate and (meth)acrylates having a hydroxyl group such as 2-hydroxy (meth)acrylate and hydroxypropyl (meth)acrylate.

The above reactive polymer emulsifier, the above nonionic emulsifier having an HLB of 12 to 16, the above oil-soluble initiator and the above acrylic monomer to form a core are uniformly mixed, and either the mixture is stirred with a disper, a homomixer or the like in the presence of an aqueous medium, or an aqueous medium is added dropwise to the mixture while the mixture is stirred, to prepare a monomer mixture in the form of oil drops. Then, the monomer mixture is polymerized under heat under nitrogen gas current, whereby an aqueous dispersion of a microgel is obtained. The microgel preferably has a Tg of 20° C. or lower to obtain a flexographic printing plate having rubbery resilience and flexibility.

The amount of the reactive polymer emulsifier per 100 parts by weight of the acrylic monomer to form a core is 1 to 20 parts by weight, preferably 2 to 15 parts by weight. The amount of the nonionic emulsifier per 100 parts by weight of the acrylic monomer to form a core is 0.1 to 15 parts by weight, preferably 0.5 to 10 parts by weight. When the amount of any one of the above emulsifiers is smaller than the lower limit of the above corresponding amount range, the stability of the emulsion is poor, or it is difficult to impart the microgel particle surface with sufficient hydrophilic nature. When the above amount is too large, the flexographic printing plate may show poor water resistance.

The amount of the oil-soluble initiator per 100 parts by weight of the acrylic monomer to form a core is preferably 0.1 to 5 parts by weight. When the amount of the oil-soluble initiator is too small, the polymerization rate does not increase as required, and the acrylic monomer may remain. When it is too large, the molecular weight of the microgel does not increase as required, and the flexographic printing plate may be poor in durability and flexibility.

The microgel is obtained as three-dimensionally crosslinked resin fine particles when it is synthesized from the above acrylic monomer alone. However, for imparting a flexographic printing plate with rubbery resilience, durability and stability of developability with time (i.e., for increasing the crosslinking degree of the core), it is preferred to use a polyfunctional acrylic monomer in combination. The polyfunctional acrylic monomer is selected from di(meth)acrylates such as ethylene glycol di(meth)acrylate, hexamethylenediol di(meth)acrylate, neopentyl glycol di(meth)acrylate and $C_{14}$-$C_{15}$ alkylene di(meth)acrylate, trimethylolpropane triacrylate, pentaerythritol tetraacrylate and glycerin triacrylate.

The amount of the above polyfunctional acrylic monomer based on the acrylic monomer to form a core is preferably 1 to 40% by weight. When the amount of the polyfunctional acrylic monomer is less than the above lower limit, the flexographic printing plate is liable to be poor in water resistance and stability of developability with time. When it is greater than the above upper limit, the microgel is liable to have too high a hardness to give a flexographic printing plate having a low hardness and flexibility.

A compound having an epoxy group and an α,β-unsaturated double bond is added to the aqueous dispersion of the microgel obtained above, and the mixture is heated, whereby an aqueous dispersion of the reactive microgel of the present invention is obtained. The compound having an epoxy group and an α,β-unsaturated double bond includes glycidyl acrylate and glycidyl methacrylate. The so-obtained aqueous dispersion of the reactive microgel is dried under heat and/or under reduced pressure, whereby a microgel powder or microgel flakes are obtained.

The average particle diameter of the reactive microgel obtained above is preferably 1 to 10 μm, more preferably 2 to 5 μm, and the reactive microgel having such an average particle diameter can be used in the photosensitive resin composition for a flexographic printing plate, provided by the present invention. When the average particle diameter of the reactive microgel is smaller than the above lower limit, the flexographic printing plate is poor in water-developability and stability of water-developability with time. When the above average particle diameter is larger than the above upper limit, the resolution of the flexographic printing plate is adversely affected. The reactive microgel generally has a refractive index of 1.46 to 1.49.

The photosensitive resin composition for a water-developable flexographic printing plate, provided by the present invention, will be explained hereinafter.

The photosensitive resin composition of the present invention contains 30 to 80 parts by weight of the above reactive microgel (A) of the present invention, 5 to 60 parts by weight of an ethylene-vinyl acetate copolymer and/or an ethylene-ethyl acrylate copolymer (B), 1 to 60 parts by weight of a compound having an α,β-ethylenically unsaturated double bond (C) and 0.01 to 10 parts by weight of a photopolymerization initiator (D).

When the amount of the tertiary amino group (A) is smaller than the above lower limit, the flexographic printing plate is liable to show no water-developability. When it is larger than the above upper limit, the flexographic printing plate is liable to be poor in strength and water resistance.

When the amount of the ethylene-vinyl acetate copolymer and/or the ethylene-ethyl acrylate copolymer (B) is smaller than the above lower limit, the flexographic printing plate is liable to be unsatisfactory in strength and water resistance. When it is larger than the above upper limit, the flexographic printing plate is liable to be poor in water-developability.

When the amount of the compound having an α,β-ethylenically unsaturated double bond (C) is smaller than the above lower limit, the flexographic printing plate is liable to be unsatisfactory in water resistance and physical properties. When it is greater than the above upper limit, the printing plate has too high a rubber hardness to be used as a flexographic printing plate.

The ethylene-vinyl acetate copolymer and the ethylene-ethyl acrylate copolymer (B) can be obtained by copolymerizing ethylene and vinyl acetate or ethyl acrylate in any amounts, while the ethylene-vinyl acetate copolymer and the ethylene-ethyl acrylate copolymer (B) preferably have a refractive index different from that of the reactive microgel of the present invention by 0.02 or less, and a JIS-A hardness of 60 or less. When the refractive index of the ethylene-vinyl acetate copolymer and/or the ethylene-ethyl acrylate copolymer (B) is different from that of the reactive microgel (h) by more than 0.2, the photosensitive resin composition is free of transparency, and the resolution required of a flexographic printing plate cannot be obtained. When the above JIS-A hardness exceeds 60, the photosensitive resin composition has a high hardness, and the use thereof for a flexographic printing plate is limited.

The compound having an α,β-ethylenically unsaturated double bond (C) serves to impart the photosensitive resin composition with photo-curability. The photosensitive resin composition containing the compound having an α,β-ethylenically unsaturated double bond in combination with the photopolymerization initiator cures itself after being exposed to light, and gives a resolution required as a flexographic printing plate when developed with water. The compound having an α,β-ethylenically unsaturated double bond (C) is not specially limited if it is compatible with the ethylene-vinyl acetate copolymer and the ethylene-ethyl acrylate copolymer (B) before and after the photosensitive resin composition is cured, or if it has almost no different refractive index from that of the above copolymer(s) (B).

The compound having an α,β-ethylenically unsaturated double bond (C) is selected from monofunctional monomers and polyfunctional monomers. The monofunctional monomers include $C_1$-$C_{22}$ alkyl (meth)acrylates such as methyl (meth)acrylate, ethyl (meth)acrylate, butyl (meth)acrylate, hexyl (meth)acrylate, 2-ethylhexyl (meth)acrylate, lauryl (meth)acrylate and stearyl (meth)acrylate, (meth)acrylates having a hydroxyl group such as 2-hydroxy (meth)acrylate and hydroxypropyl (meth)acrylate, norbornyl (meth)acrylate, vinylpyrrolidone, vinylaniline and acrylamide.

The polyfunctional monomers include ethylene glycol di(meth)acrylate, hexamethylenediol di(meth)acrylate, neopentyl glycol di(meth)acrylate, $C_{14}$-$C_{15}$ alkylene di(meth)acrylate, trimethylolpropane triacrylate, pentaerythritol tetraacrylate and glycerin triacrylate, polyester acrylate, polyurethane acrylate and polyol acrylate.

The polyfunctional monomer is preferred since it is excellent in photo-curability. The above polyfunctional monomers may be used alone or in combination. Further, the polyfunctional monomer may be used in combination with the monofunctional monomer.

The photopolymerization initiator (D) is not specially limited if it reacts when exposed to ultraviolet light or the like and cures the above monomers. The photopolymerization initiator (D) includes benzoin ethers, benzophenones, xanthones and acetophenones. These initiators may be used alone or in combination. Further, the photopolymerization initiator (D) may be used In combination with a photo-initiator auxiliary selected from amines.

The photosensitive resin composition for a water-developable flexographic printing plate, provided by the present invention, may further contain an organic or inorganic filler, a heat polymerization inhibitor, an antioxidant, a preventer for deterioration with ozone, a dye and a flow regulator.

The photosensitive resin composition of the present invention is kneaded with a kneading apparatus such as a two-roll mill, a Banbury mixer, a kneader or an extruder, and formed into a laminate of a substrate film, the photosensitive resin composition and a cover film to obtain a water-developable flexographic printing plate. The so-obtained water-developable flexographic printing plate is exposed to light through the substrate film, the cover film is removed, and a negative film is intimately attached. The resultant printing plate is exposed to light in an appropriate dose, developed by brush-washing an unexposed portion with water or hot water, dried and post-exposed to obtain a flexographic printing plate.

EXAMPLES

The present invention will be detailed hereinafter with reference to Examples, in which "part" stands for "part by weight".

Example 1

A two-liter flask was charged with 195 parts of N,N-dimethylaminoethyl methacrylate, 455 parts of n-lauryl methacrylate and 350 parts of isopropanol, and while the mixture was stirred under nitrogen current, the mixture was temperature-increased to 75° C. Then, 6.5 parts of azobisisobutyronitrile was added, and the mixture was heated at 80° C. for 5 hours to give a polymer solution. The polymer solution was allowed to stand overnight at room temperature, and 75 parts of acetic acid and 50 parts of glycidyl methacrylate were added. While the mixture was stirred under air current, the mixture was heated at 50° C. for 5 hours to give a reactive polymer emulsifier solution.

A two-liter flask was charged with 50 parts of the above-obtained reactive polymer emulsifier, 15 parts of a nonionic emulsifier ("Emulgen 420", HLB 13.6, supplied by Kao Corp.), 270 parts of 2-ethylhexyl acrylate, 30 parts of hexamethylene glycol diacrylate and 2 parts of azobisisobutyronitrile, and while the mixture was moderately stirred at room temperature, 600 parts of ion-exchanged water was dropwise added over 1 hour. Then, under nitrogen current, the mixture was temperature-increased to 80° C. and maintained at this temperature for 3 hours to give an aqueous dispersion of a microgel. The aqueous dispersion of a microgel was allowed to stand overnight at room temperature, and then 20 parts of glycidyl methacrylate was added. The mixture was heated at 50° C. for 3 hours to give an aqueous dispersion of a reactive microgel. The aqueous dispersion of a reactive microgel was measured for an average particle diameter by a light scattering method to show 3 μm. The aqueous dispersion also showed a refractive index of 1.47. The aqueous dispersion of a reactive microgel was freeze-dried to give a white powder.

60 Parts of the above-obtained reactive microgel powder, 30 parts of an ethylene-vinyl acetate copolymer ("Evaflex EV40X", JIS-A hardness 43, refractive index 1.48, supplied by Du Pont-Mitsui Polychemicals Co., Ltd.), 10 parts of hexamethylene glycol diacrylate, 0.5 part of a photopolymerization initiator ("Darocure 1173", supplied by Merck) and 0.1 part of hydroquinone were kneaded with a double-armed kneader at room temperature for 20 minutes. Then, the resultant composition was sandwiched with polyester films and pressed to give a raw flexographic printing plate having a thickness of 1.5 mm. One surface of the raw flexographic printing plate was exposed to a 15 W ultraviolet light lamp for 10 seconds, and then, the polyester film forming the other surface was removed. A negative film was intimately attached to the revealed surface, and the surface was exposed to the 15 W ultraviolet light lamp for 3 minutes. The raw flexographic printing plate was developed by brush-washing it with water for 10 minutes, dried at 60° C. for 15 minutes, and post-exposed to the 15 W ultraviolet light lamp for 10 minutes to give a flexographic printing plate. The so-obtained flexographic printing plate had a JIS-A hardness of 50, and it showed a thickness change of 1.8% after tested for water resistance by immersing it in ion-exchanged water for 1 day. Concerning the transparency, the raw flexographic printing plate had a haze value of 30, and the cured flexographic printing plate had a haze value of 35. The raw flexographic printing plate showed almost no change in water-developability after being allowed to stand at 50° C. for 2 months and after being allowed to stand at 120° C. for 2 hours.

Example 2

50 Parts of the same reactive microgel powder as that obtained in Example 1, 30 parts of an ethylene-vinyl acetate copolymer ("Evaflex EV45LX", JIS-A hardness 34, refractive index 1.47, supplied by Du Pont-Mitsui Polychemicals Co., Ltd.), 15 parts of $C_{14}$–$C_{15}$ alkyl diacrylate ("SR2000A", supplied by Kayaku Sartomer K.K.) and 0.1 part of a photopolymerization initiator ("Irgacure 651", supplied by Ciba Geigy) were kneaded with a two-roll mill for 10 minutes. Then, the resultant composition was processed in the same manner as in Example 1 to give a raw flexographic printing plate having a thickness of 1.5 mm. The raw flexographic printing plate was exposed, developed and post-exposed in the same manner as in Example 1 to give a flexographic printing plate. The so-obtained flexographic printing plate had a JIS-A hardness of 45, and it showed a thickness change of 1.9% after tested for water resistance by immersing it in ion-exchanged water for 1 day. Concerning the transparency, the raw flexographic printing plate had a haze value of 36, and the cured flexographic printing plate had a haze value of 40. The raw flexographic printing plate showed almost no change in water-developability after being allowed to stand at 50° C. for 2 months, and after being allowed to stand at 120° C. for 2 hours.

Example 3

50 Parts of the same reactive microgel powder as that obtained in Example 1, 35 parts of an ethylene-ethyl acrylate copolymer ("Evaflex EEA A-709", JIS-A hardness 49, refractive index 1.47, supplied by Du Pont-Mitsui Polychemicals Co., Ltd.), 15 parts of $C_{14}$–$C_{15}$ alkyl diacrylate ("SR2000A", supplied by Kayaku Sartomer K.K.) and 0.1 part of a photopolymerization initiator ("Irgacure 651", supplied by Ciba Geigy.).were kneaded with a two-roll mill for 10 minutes. Then, the resultant composition was processed in the same manner as in Example 1 to give a raw flexographic printing plate having a thickness of 1.5 mm. The raw flexographic printing plate was exposed, developed and post-exposed in the same manner as in Example 1 to give a flexographic printing plate. The so-obtained flexographic printing plate had a JIS-A hardness of 48, and it showed a thickness change of 1.7% after tested for water resistance by immersing it in ion-exchanged water for 1 day. Concerning the transparency, the raw flexographic printing plate had a haze value of 34, and the cured flexographic printing plate had a haze value of 30. The raw flexographic printing plate showed almost no change in water-developability after being allowed to stand at 50° C. for 2 months, and after being allowed to stand at 120° C. for 2 hours.

Example 4

A two-liter flask was charged with 195 parts of N,N-diethylaminoethyl methacrylate, 455 parts of 2-ethylhexyl methacrylate and 350 parts of isopropanol, and while the mixture was stirred under nitrogen current, the mixture was temperature-increased to 75° C. Then, 6.5 parts of azobisisobutyronitrile was added, and the mixture was heated at 80° C. for 5 hours to give a polymer solution. The polymer solution was allowed to stand overnight at room temperature, and 60 parts of acetic acid and 50 parts of glycidyl methacrylate were added. While the mixture was stirred under air current, the mixture was heated at 50° C. for 5 hours to give a reactive polymer emulsifier solution.

A two-liter flask was charged with 50 parts of the above-obtained reactive polymer emulsifier, 10 parts of a nonionic emulsifier ("Emulgen 120", HLB 15.3, supplied by Kao Corp.), 270 parts of 2-ethylhexyl acrylate, 40 parts of $C_{14}$–$C_{15}$ alkyl diacrylate and 2 parts of azobisisobutyronitrile, and while the mixture was moderately stirred at room temperature, 600 parts of ion-exchanged water was dropwise added over 1 hour. Then, under nitrogen current, the mixture was temperature-increased to 65° C. and maintained at this temperature for 3 hours to give an aqueous dispersion of a microgel. The aqueous dispersion of a microgel was allowed to stand overnight at room temperature, and then 20 parts of glycidyl methacrylate was added. The mixture was heated at 50° C. for 3 hours to give an aqueous dispersion of a reactive microgel. The aqueous dispersion of a reactive microgel was measured for an average particle diameter by a light scattering method to show 3 μm. The aqueous dispersion also showed a refractive index of 1.47. The aqueous dispersion of a reactive microgel was freeze-dried to give a white powder.

50 Parts of the above-obtained reactive microgel powder, 40 parts of an ethylene-vinyl acetate copolymer ("Evaflex EV40X", JIS-A hardness 43, refractive index 1.48, supplied by Du Pont-Mitsui Polychemicals Co., Ltd.), 5 parts of dipentaerythritol hexaacrylate, 5 parts of isophorone acrylate, 0.5 part of a photopolymerization initiator ("Darocure 1173", supplied by Merck) and 0.1 part of hydroquinone were kneaded with a twin-screw kneader at 100° C. for 5 minutes. Then, the resultant composition was processed in the same manner as in Example 1 to give a raw flexographic printing plate having a thickness of 1.5 mm. The raw flexographic printing plate was exposed, developed and post-exposed in the same manner as in Example 1 to give a flexographic printing plate. The so-obtained flexographic printing plate had a JIS-A hardness of 45, and it showed a thickness change of 2.0% after tested for water resistance by immersing it in ion-exchanged water for 1 day. Concerning the transparency, the raw flexographic printing plate had a haze value of 35, and the cured flexographic printing plate had a haze value of 35. The raw flexographic printing plate showed almost no change in water-developability after being allowed to stand at 50° C. for 2 months, and after being allowed to stand at 120° C. for 2 hours.

Example 1

60 Parts of the same reactive microgel powder as that obtained in Example 1, 30 parts of an ethylene-vinyl acetate copolymer ("Evaflex EV450", JIS-A hardness 90, refractive index 1.49, supplied by Du Pont-Mitsui Polychemicals Co., Ltd.), 10 parts of hexamethylene glycol diacrylate, 0.5 part of a photopolymerization initiator ("Darocure 1173", supplied by Merck) and 0.1 part of hydroquinone were kneaded with a double-armed kneader at room temperature for 20 minutes. Then, the resultant composition was processed in the same manner as in Example 1 to give a raw flexographic printing plate having a thickness of 1.5 mm. The raw flexographic printing plate was exposed, developed and post-exposed in the same manner as in Example 1 to give a flexographic printing plate. The so-obtained flexographic printing plate had a JIS-A hardness of 75, and it showed a thickness change of 1.7% after being tested for water resistance by immersing it in ion-exchanged water for 1 day. Concerning the transparency, the raw flexographic printing plate had a haze value of 60, and the cured flexographic printing plate had a haze value of 57. The raw flexographic printing plate showed almost no change in water-developability after being allowed to stand at 50° C. for 2 months, and after being allowed to stand at 120° C. for 2 hours.

Comparative Example 1

A 2-liter flask was charged with 15 parts of a nonionic emulsifier ("Emulgen 420", HLB 13.6), 270 parts of 2-ethylhexyl acrylate, 30 parts of hexamethylene glycol diacrylate and 2 parts of azobisisobutyronitrile, and while the mixture was stirred at room temperature, 600 parts of ion-exchanged water was dropwise added over 1 hour. Then, the mixture was temperature-increased to 80° C. under nitrogen current to carry out the polymerization, while the polymerization was not carried out stably and the mixture was gelled.

Comparative Example 2

A two-liter flask was charged with 50 parts of the same reactive polymer emulsifier as that obtained in Example 1, 15 parts of a nonionic emulsifier ("Emulgen 950", HLB 18.2, supplied by Kao Corp.), 270 parts of 2-ethylhexyl acrylate, 30 parts of hexamethylene glycol diacrylate and 2 parts of azobisisobutyronitrile, and while the mixture was moderately stirred at room temperature, 600 parts of ion-exchanged water was dropwise added over 1 hour. Then, the mixture was temperature-increased to 80° C. under nitrogen current to carry out the polymerization, while the polymerization was not carried out stably and the mixture was gelled.

Comparative Example 3

A two-liter flask was charged with 270 parts of 2-ethylhexyl acrylate, 30 parts of hexamethylene glycol diacrylate, 10 parts of sodium dodecylbenzenesulfonate, 15 parts of a nonionic emulsifier ("Emulgen 420", HLB 13.6, supplied by Kao Corp.) and 600 parts of ion-exchanged water, and while the mixture was stirred, the mixture was temperature-increased to 65° C. under nitrogen current. Further, 20 parts of a 5% ammonium persulfate aqueous solution and 20 parts of a 5% sodium thiosulfate aqueous solution both of which were water-soluble polymerization initiators were added, and the mixture was heated at 70° C. for 5 hours to give an aqueous dispersion of a microgel having an average particle diameter, measured by a light scattering method, of 0.2 μm and a refractive index of 1.47. The so-obtained aqueous dispersion of a microgel was freeze-dried to give a white powder.

60 Parts of the above-obtained reactive microgel powder, 30 parts of an ethylene-vinyl acetate copolymer ("Evaflex EV40X", JIS-A hardness 43, refractive index 1.48, supplied by Du Pont-Mitsui Polychemicals Co., Ltd.), 10 parts of hexamethylene glycol diacrylate, 0.5 part of a photopolymerization initiator ("Darocure 1173", supplied by Merck) and 0.1 part of hydroquinone were kneaded with a double-armed kneader at room temperature for 20 minutes. Then, the kneaded mixture was processed in the same manner as in Example 1 to give a raw flexographic printing plate having a thickness of 1.5 mm. This raw flexographic printing plate showed no developability with water at 50° C. when it was in a non-exposed state.

Comparative Example 4

A two-liter flask was charged with 130 parts of methacrylic acid, 520 parts of n-lauryl methacrylate and 350 parts of isopropanol, and the mixture was temperature-increased to 75° C. with stirring under nitrogen current. Then, 6.5 parts of azobisisobutyronitrile was added, and the mixture was heated at 80° C. for 5 hours to give a polymer solution. This polymer solution was allowed to stand overnight at room temperature, and 600 parts of a 10% sodium hydroxide aqueous solution was added to give a polymer emulsifier solution.

A two-liter flask was charged with 80 parts of the above-obtained polymer emulsifier, 15 parts of a nonionic emulsifier ("Emulgen 420", HLB 13.6, supplied by Kao Corp.), 270 parts of 2-ethylhexyl acrylate, 30 parts of hexamethylene glycol diacrylate and 2 parts of azobisisobutyronitrile, and while the mixture was moderately stirred under nitrogen current, 600 parts of ion-exchanged water was added over 1 hour. Then, under nitrogen current, the mixture was temperature-increased to 80° C. and this temperature was maintained for 3 hours to give an aqueous dispersion of a microgel. The aqueous dispersion of a reactive microgel was measured for an average particle diameter by a light scattering method to show 3 μm. The aqueous dispersion also showed a refractive index of 1.47. The aqueous dispersion of a reactive microgel was freeze-dried to give a white powder.

60 Parts of the above-obtained microgel powder, 30 parts of an ethylene-vinyl acetate copolymer ("Evaflex EV40X", JIS-A hardness 43, refractive index 1.48, supplied by Du Pont-Mitsui Polychemicals Co., Ltd.), 10 parts of hexamethylene glycol diacrylate, 0.5 part of a photopolymerization initiator ("Darocure 1173", supplied by Merck) and 0.1 part of hydroquinone were kneaded with a double-armed kneader at room temperature for 20 minutes. Then, the resultant composition was processed in the same manner as in Example 1 to give a raw flexographic printing plate having a thickness of 1.5 mm. The raw flexographic printing plate was exposed, developed and post-exposed in the same manner as in Example 1 to give a flexographic printing plate. The so-obtained flexographic printing plate had a JIS-A hardness of 50, while it showed a thickness change of 8.0% after being tested for water resistance by immersing it in ion-exchanged water for 1 day. The immersed flexographic printing plate was considerably fragile.

Comparative Example 5

A two-liter flask was charged with 50 parts of the same reactive polymer emulsifier as that obtained in Example 1, 15 parts of a nonionic emulsifier ("Emulgen 420", HLB 13.6, supplied by Kao Corp.), 270 parts of 2-ethylhexyl acrylate, 30 parts of hexamethylene glycol diacrylate and 2 parts of azobisisobutyronitrile, and while the mixture was vigorously stirred at room temperature, 600 parts of ion-exchanged water was dropwise added over 1 hour. Then, the mixture was stirred with a homomixer for 60 minutes. Under nitrogen current, the mixture was temperature-increased to 80° V., and this temperature was maintained for 3 hours to give an aqueous dispersion of a microgel. The so-obtained aqueous dispersion of a microgel was allowed to stand overnight at room temperature. Then, 20 parts of glycidyl methacrylate was added, and the mixture was heated at 50° C. for 3 hours to give an aqueous dispersion of a reactive microgel. The aqueous dispersion of a reactive microgel was measured for an average particle diameter by a light scattering method to show 0.4 μm. The aqueous dispersion also showed a refractive index of 1.47. The aqueous dispersion of a reactive microgel was freeze-dried to give a white powder.

60 Parts of the above-obtained reactive microgel powder, 30 parts of an ethylene-vinyl acetate copolymer ("Evaflex EV40X", JIS-A hardness 43, refractive index 1.48, supplied by Du Pont-Mitsui Polychemicals Co., Ltd.), 10 parts of hexamethylene glycol diacrylate, 0.5 part of a photopolymerization initiator ("Darocure 1173", supplied by Merck) and 0.1 part of hydroquinone were kneaded with a double-armed kneader at room temperature for 20 minutes. Then, the resultant composition was processed in the same manner as in Example 1 to give a raw flexographic printing plate having a thickness of 1.5 mm. The raw flexographic printing plate was exposed, developed and post-exposed in the same manner as in Example 1 to give a flexographic printing plate. The so-obtained flexographic printing plate had a JIS-A hardness of 50, and it showed a thickness change of 1.8% after tested for water resistance by immersing it in ion-exchanged water for 1 day. Concerning the transparency, the raw flexographic printing plate had a haze value of 30, and the cured flexographic printing plate had a haze value of 35. However, the raw flexographic printing plate showed no developability with water after being allowed to stand at 50° C. for 3 days.

Comparative Example 6

50 Parts of the same reactive microgel powder as that obtained in Example 1, 35 parts of an ethylene-propylene rubber ("JSREP11", refractive index 1.47, supplied by Japan Synthetic Rubber), 15 parts of $C_{14}$–$C_{15}$ alkyl diacrylate ("SR2000A", supplied by Kayaku Sartomer K.K.) and 0.1 part of a photopolymerization initiator ("Irgacure 651", supplied by Ciba Geigy) were kneaded with a two-roll mill for 10 minutes. Then, the resultant composition was processed in the same manner as in Example 1 to give a raw flexographic printing plate having a thickness of 1.5 mm. This raw flexographic printing plate had a haze value of 30 or had excellent transparency. However, when the flexographic printing plate was exposed to a 15 W ultraviolet light lamp for 20 minutes, it was free of flexibility and not suitable for the use thereof as a flexographic printing plate.

Comparative Example 7

50 Parts of the same reactive microgel powder as that obtained in Example 1, 35 parts of an acrylic rubber ("AR72HF", refractive index 1.47, supplied by Nippon Zeon Co., Ltd.), 15 parts of $C_{14}$–$C_{15}$ alkyl diacrylate ("SR2000A", supplied by Kayaku Sartomer K.K.) and 0.1 part of a photopolymerization initiator ("Irgacure 651", supplied by Ciba Geigy) were kneaded with a two-roll mill for 10 minutes. Then, the resultant composition as processed in the same manner as in Example 1 to give a raw flexographic printing plate having a thickness of 1.5 mm. This raw flexographic printing plate had a haze value of 30 or had excellent transparency. However, when the flexographic printing plate was cured by exposing it to a 15 W ultraviolet light lamp for 20 minutes and immersed in water for 25 hours, it showed a thickness change of over 8, and was not suitable for the use thereof as a flexographic printing plate.

Comparative Example 8

50 Parts of the same reactive microgel powder as that obtained in Example 1, 35 parts of a butadiene rubber ("JSRBR02LL", refractive index 1.51, supplied by Japan Synthetic Rubber), 15 parts of $C_{14}$–$C_{15}$ alkyl diacrylate ("SR2000A", supplied by Kayaku Sartomer K.K.) and 0.1 part of a photopolymerization initiator ("Irgacure 651", supplied by Ciba Geigy) were kneaded with a two-roll mill for 10 minutes. Then, the resultant composition was processed in the same manner as in Example 1 to give a raw flexographic printing plate having a thickness of 1.5 mm. This raw flexographic printing plate had a haze value of 96 or had no transparency, and no resolution was achieved.

As explained above, according to the present invention, a resin composition for a water- or hot water-developable photosensitive flexographic printing plate excellent in water resistance, flexibility, heat resistance, oxidation resistance and ozone resistance and a reactive microgel suitable for use therefor can be produced stably at a low cost.

What is claimed is:

1. A reactive microgel having an average particle diameter of 1 to 10 μm, formed of microgel particles, as a core, synthesized from an acrylic monomer in an aqueous medium in the presence of an oil-soluble initiator and in the presence of a reactive polymer emulsifier which is an adduct of a neutralized product of an acrylic copolymer having a tertiary amino group with a compound having an epoxy group and an α,β-unsaturated double bond, and a nonionic emulsifier having an HLB of 12 to 16, and a compound having an epoxy group and an α,β-unsaturated double bond, attached to surfaces of the microgel particles.

2. A reactive microgel according to claim 1, wherein the acrylic copolymer having a tertiary amino group is a copolymer obtained by polymerizing an acrylic monomer having a tertiary amino group and other acrylic monomer.

3. A reactive microgel according to claim 2, wherein the acrylic copolymer having a tertiary amino group contains 10 to 50% by weight of a component from the acrylic monomer having a tertiary amino group.

4. A reactive microgel according to claim 1, wherein the acrylic copolymer having a tertiary amino group has a glass transition temperature of 20° C. or lower.

5. A reactive microgel according to claim 1, wherein the microgel particles are microgel particles synthesized in the presence of the reactive polymer emulsifier in an amount of 1 to 20 parts by weight per 100 parts by weight of the acrylic monomer to form the core.

6. A reactive microgel according to claim 1, wherein the microgel particles are microgel particles synthesized in the presence of the nonionic emulsifier in an amount of 0.1 to 15 parts by weight per 100 parts by weight of the acrylic monomer to form the core.

7. A reactive microgel according to claim 1, wherein the microgel particles are microgel particles synthesized in the presence of the oil-soluble initiator in an amount of 0.1 to 5 parts by weight per 100 parts by weight of the acrylic monomer to form the core.

8. A reactive microgel according to claim 1, wherein the microgel particles are microgel particles synthesized from the acrylic monomer containing 1 to 40% by weight of a polyfunctional acrylic monomer.

9. A reactive microgel according to claim 1, wherein the reactive microgel has a refractive index of 1.46 to 1.49.

* * * * *